(12) United States Patent
van Elzakker

(10) Patent No.: US 10,128,867 B1
(45) Date of Patent: Nov. 13, 2018

(54) HIERARCHICAL UNARY/THERMOMETER CODER FOR CONTROLLING AN ANALOG TO DIGITAL CONVERTER

(71) Applicant: Semiconductor Ideas to the Market (ITOM) B.V., Eindhoven (NL)

(72) Inventor: Michiel Johannes Karel van Elzakker, Eindhoven (NL)

(73) Assignee: SEMICONDUCTOR IDEAS TO THE MARKET EINDHOVEN (NL)

( * ) Notice: Subject to any disclaimer, the term of this patent is extended or adjusted under 35 U.S.C. 154(b) by 0 days.

(21) Appl. No.: 15/808,863

(22) Filed: Nov. 9, 2017

Related U.S. Application Data

(60) Provisional application No. 62/559,293, filed on Sep. 15, 2017.

(51) Int. Cl.
*H03M 7/16* (2006.01)
*H03M 1/12* (2006.01)
*H03M 1/46* (2006.01)

(52) U.S. Cl.
CPC .......... *H03M 7/165* (2013.01); *H03M 1/124* (2013.01); *H03M 1/46* (2013.01)

(58) Field of Classification Search
CPC ......... H03M 7/165; H03M 1/46; H03M 1/124
USPC ...................................................... 341/96, 50
See application file for complete search history.

(56) References Cited

U.S. PATENT DOCUMENTS

| | | | | |
|---|---|---|---|---|
| 6,310,653 B1 * | 10/2001 | Malcolm, Jr. | ........... | H03L 7/085 327/156 |
| 8,022,854 B2 * | 9/2011 | Glass | ................... | H03M 7/165 341/159 |
| 9,083,365 B1 * | 7/2015 | Xiao | ................... | H03M 1/0809 |
| 9,100,046 B2 * | 8/2015 | Granger-Jones | ...... | H03M 1/682 |

* cited by examiner

*Primary Examiner* — Brian Young
(74) *Attorney, Agent, or Firm* — Robert M. McDermott

(57) ABSTRACT

A hierarchical unary/thermometer coder comprises a cascade of lower level coders that minimize clock loading and clock transitions by only enabling the clocking of a circuit when that circuit is required to change state, thereby minimizing power consumption. At the lowest level, a stage-1 circuit produces a two-bit unary/thermometer code using two NAND gates, an inverter, and a single set-reset latch. An output of the latch forms a least significant bit (LSB) and is used to control transitions of the next most significant bit. A stage-2 circuit produces a four-bit unary/thermometer code using two stage-1 circuits and a NOR gate. A stage-3 circuit produces an eight-bit unary/thermometer code using two stage-2 circuits and a NAND gate. The circuit associated with each higher order bit is only enabled when the next lower bit has been set. Outputs are also provided for generating a "running one" or "running zero" code.

12 Claims, 4 Drawing Sheets

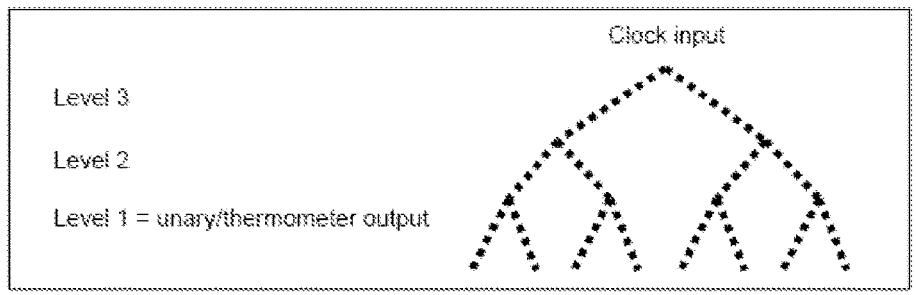
Fig. 3a: Unary/thermometer coder after reset (output value: 0000 0000)
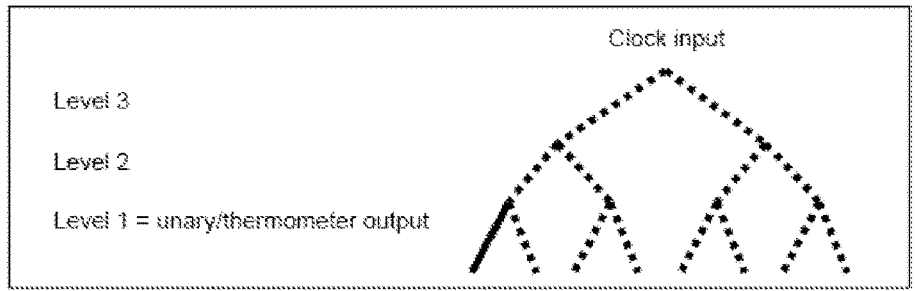
Fig. 3b: Unary/thermometer coder after one clock edge (output value: 1000 0000)
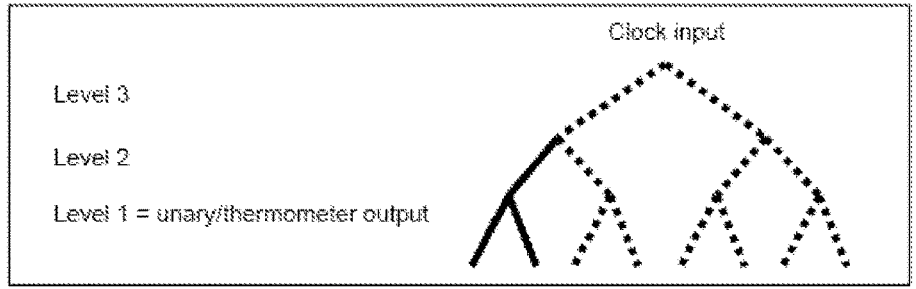
Fig. 3c: Unary/thermometer coder after two clock edges (output value: 1100 0000)
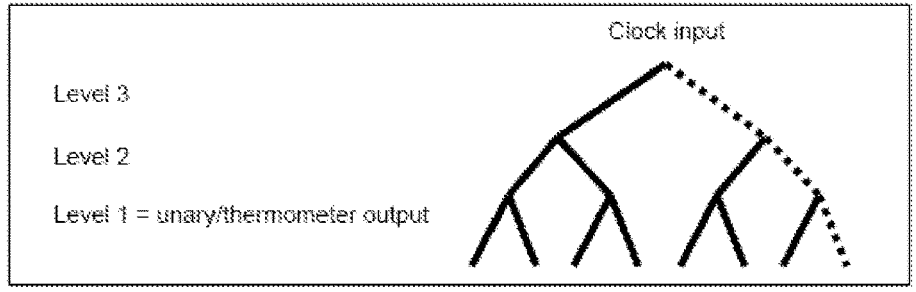
Fig. 3d: Unary/thermometer coder after seven clock edges (output value: 1111 1110)
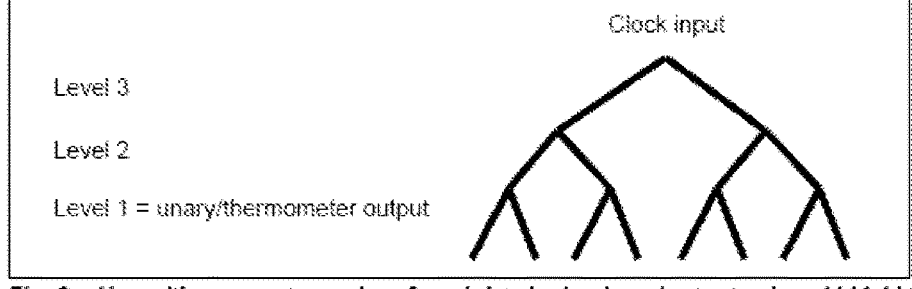
Fig. 3e: Unary/thermometer coder after eight clock edges (output value: 1111 1111)

HIERARCHICAL UNARY/THERMOMETER CODER FOR CONTROLLING AN ANALOG TO DIGITAL CONVERTER

This application claims priority to U.S. Provisional Patent Application 62/559,293, filed 15 Sep. 2017.

The present invention relates to a logic circuit for converting a digital clock signal to a unary/thermometer control signal. In particular the invention relates to a logic circuit forming a unary/thermometer coder for a digital controller for a low power successive approximation type of analog-to-digital converter (SAR ADC). However, the coder according to the present invention is also suitable for other low power digital applications, such as "Internet Of Things Devices", "Wireless Sensor Nodes", "Ultra Low Power Digital Signal Processor" and/or "Ultra Low Power digital circuits".

SAR ADCs are circuits that comprise a sample-and-hold-circuit for sampling an input signal, a comparator, for comparing the sample to the output of a digital to analog converter (DAC) and a controller, for controlling the DAC based on the comparison of the sample and the DAC output. In general, the controller may be configured for activating functional blocks in a specific order, which may, for a SAR ADC algorithm, comprise activating a sample-and-hold switch, activating a comparator, storing comparator results in a register, changing DAC values, making register contents available at an ADC output, or resetting internal register contents.

The controller may thereto receive a digital clock signal that is converted by a coder into a signal that is suitable for use by the algorithm decoder of the controller. Such a signal may be in the form of a unary/thermometer signal (wherein an increasing number of digital one's in a string of bits indicates a higher value), a running one signal (wherein the position of a digital one in a string indicates a value), or dual equivalents with numbers or positions of digital zeros.

The conversion of a clock signal to one of the above signal forms is performed by logic circuitry, which are according to the state of the art, in particular circuits comprised of digital flip flops. However, these state of the art solutions have the disadvantage that they consume a relatively high power, especially their dynamic supply current, i.e. a current required for state changes, is rather high and in most cases, it is dominant over the leakage current. This dynamic supply current increases with the ripple path, which is the number of electronic nodes that toggle in response to a clock or signal edge, the average capacitive load on these nodes, which depends on the number of digital gates that are driven, the frequency of operation, the supply voltage, and temperature and process parameters.

It is therefore a goal of the present invention to provide a logic circuit for converting a digital clock signal to a control signal that lacks the above mentioned disadvantages.

The invention provides a unary/thermometer coding circuit for converting a digital clock signal to a control signal for an analog to digital converter, the circuit comprising:
 a first logic circuit that receives a first clock input and a first enable input and provides a first clocking signal;
 a set-reset latch that receives the first clocking signal as a set input, and a first reset input as a reset input and provides a first output; and
 a second logic circuit that receives the first clocking signal and the first latch output to provide a second output;
 wherein the first output and the second output form a two-bit unary/thermometer code based on the first clock input.

A first improvement over the prior art is the use of logic gates, in particular NAND gates, NOR gates, and inverters. Herewith, the unary/thermometer coder avoids regular flip-flops during normal operation, which leads to a reduction of the dynamic supply current, since flip flops have a larger internal number of digital gates that are driven. The topology itself takes away the need for a clock tree, and it lacks a long and wide ripple path, which is the number of electronic nodes that toggle in response to a clock or signal edge.

In state of the art low power digital design, clock gating can be used to reduce the ripple path. Clock gating control signals are derived from the state of the flip-flops. In this new topology, the same gates are used both to hold the digital output and to configure the internal multiplexing to propagate the next input clock edge only to where it is required.

Additionally, the coder according to the invention can be combined with a lower frequency of operation and a lower supply voltage to achieve lower power consumption over a certain range.

As an option, standard flip-flops can be used to implement low-level testability. These only need to be active during test-mode, when the device is powered from a tester without relevant power limitations.

The logic circuit according to the invention in its simplest form (FIG. 4) provides a circuit SL1 for providing a unary/thermometer output Q1, Q0 passed on a clock signal C1. In this simplest form only two outputs are present, however this circuit can be cascaded with similar or in particular, the same circuit to form an n-stage unary/thermometer circuit.

In order to enable building a circuit that outputs a running one, in an embodiment, the first clocking signal P may be made available as an output connection.

In all cases, the circuit according to the invention reacts on both a positive and a negative clock edge C1. It is to be understood throughout this application that equivalent circuits to the ones presented and/or claimed are part of the invention as well.

In a further embodiment (FIG. 5), the invention comprises a second level assembly SL2 comprising two electronic circuits like the one described above, SL1A and SL1B, and comprising:
 a third logic circuit that receives a second clock input C2 and a second enable input E2 and provides a second clocking signal P2;
 a first instantiation of the first stage SL1B circuit that provides the first and second output signals Q0B, Q1B; and
 a second instantiation of the first stage circuit SL1A that provides a third output signal and a fourth output signal Q0A, Q1A;
 wherein:
 the second clocking signal P2 is coupled to the first clock input of the first and second instantiations of the first stage circuits;
 NOT(the second output signal) (QN1B) is coupled to the first enable input E1 of the first instantiation of the first stage circuit SL1B;
 a second reset input R2 is coupled to the first reset input R1 of the first instantiation of the first stage circuit SL1B;
 the second output signal Q1B is coupled to the first enable input E1 and the first reset input R1 of the second instantiation of the first stage circuit SL1A; and
 the first, second, third, and fourth outputs Q0B, Q1B, Q0A, Q1A form a four-bit unary/thermometer code based on the second clock input, Q0B being the least significant bit.

Also for the assembly of the second stage circuit, in an embodiment, the clocking signal P of the first logic NAND gates of the respective circuits SL1A, SL1B may be made available as output connections PA, PB for creating a running one, or running zero circuit.

The circuit according to the invention may be cascaded multiple times. Every next level is formed by combining two assemblies of the previous level, alternatingly combined with a logic NOR or a logic NAND gate for forming the corresponding clocking signal, as detailed further below.

The invention will now be presented in more detail with reference to the following figures. Herein:

Figure 4:
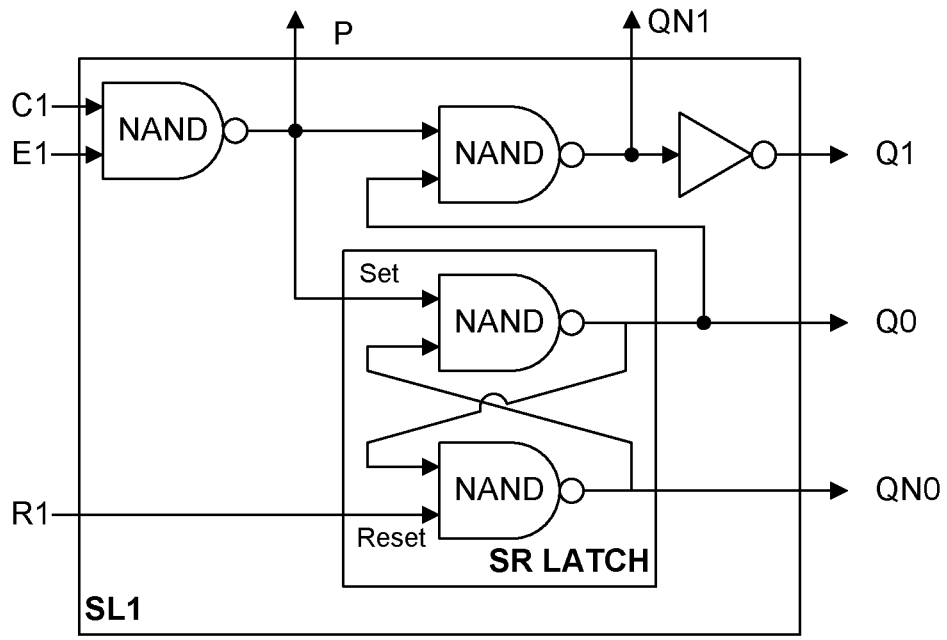
Figure 5:
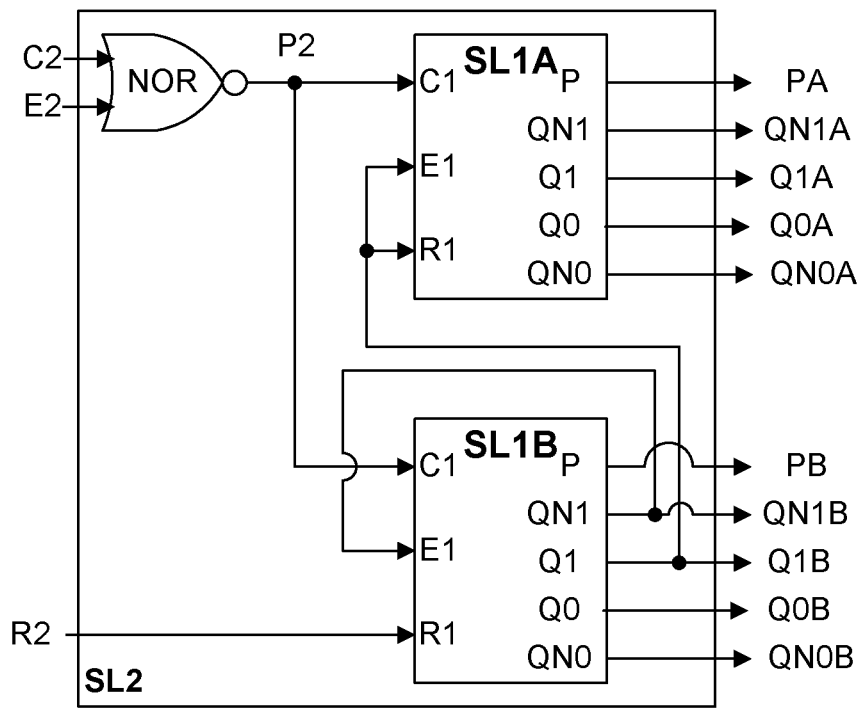
Figure 6:
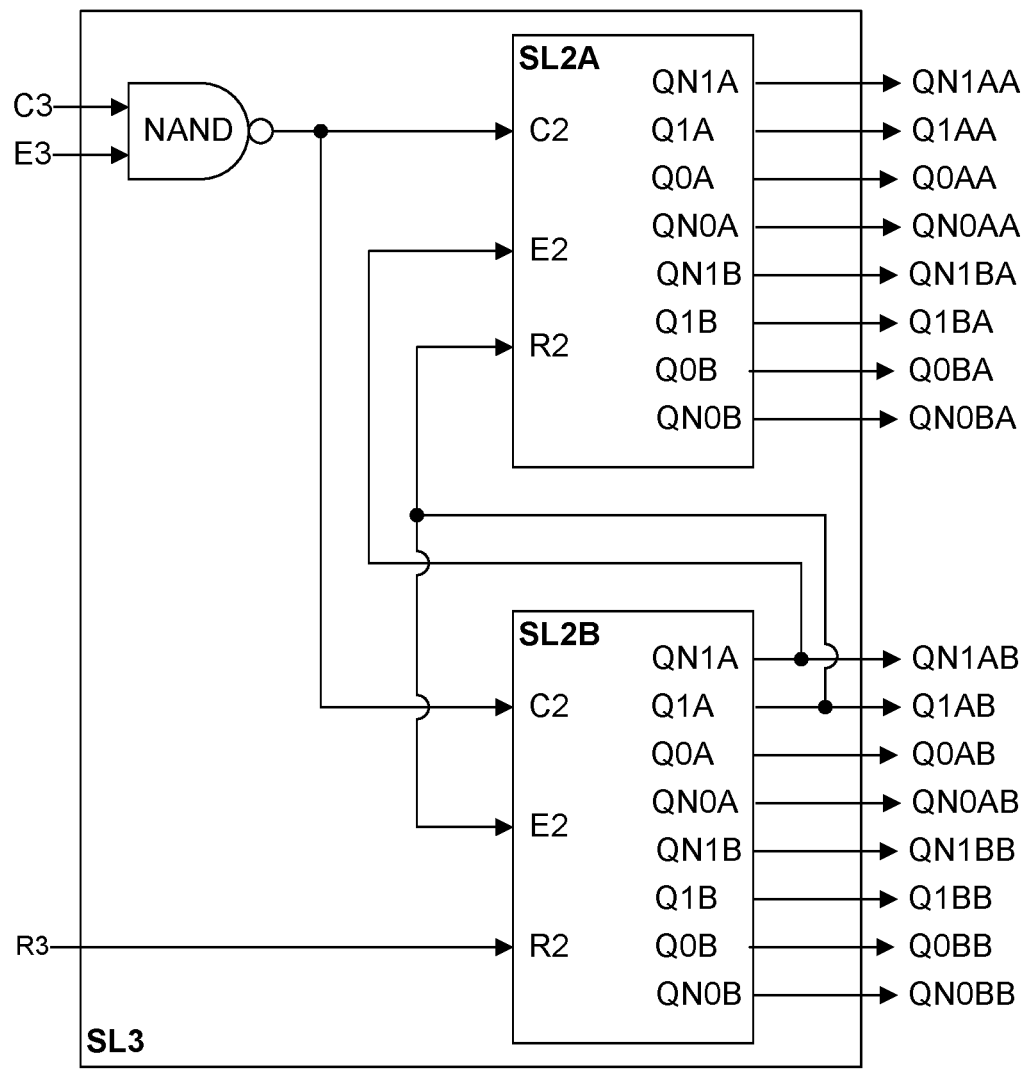

FIGS. 3a-e show coder outputs after various numbers of clock edges;

FIG. 4 shows an electronic circuit according to the invention;

FIG. 5 shows a hierarchical unary/thermometer coder comprising two electronic circuits from FIG. 4;

FIG. 6 shows a hierarchical unary/thermometer coder comprising two assemblies from FIG. 5.

Figures 1, 2:
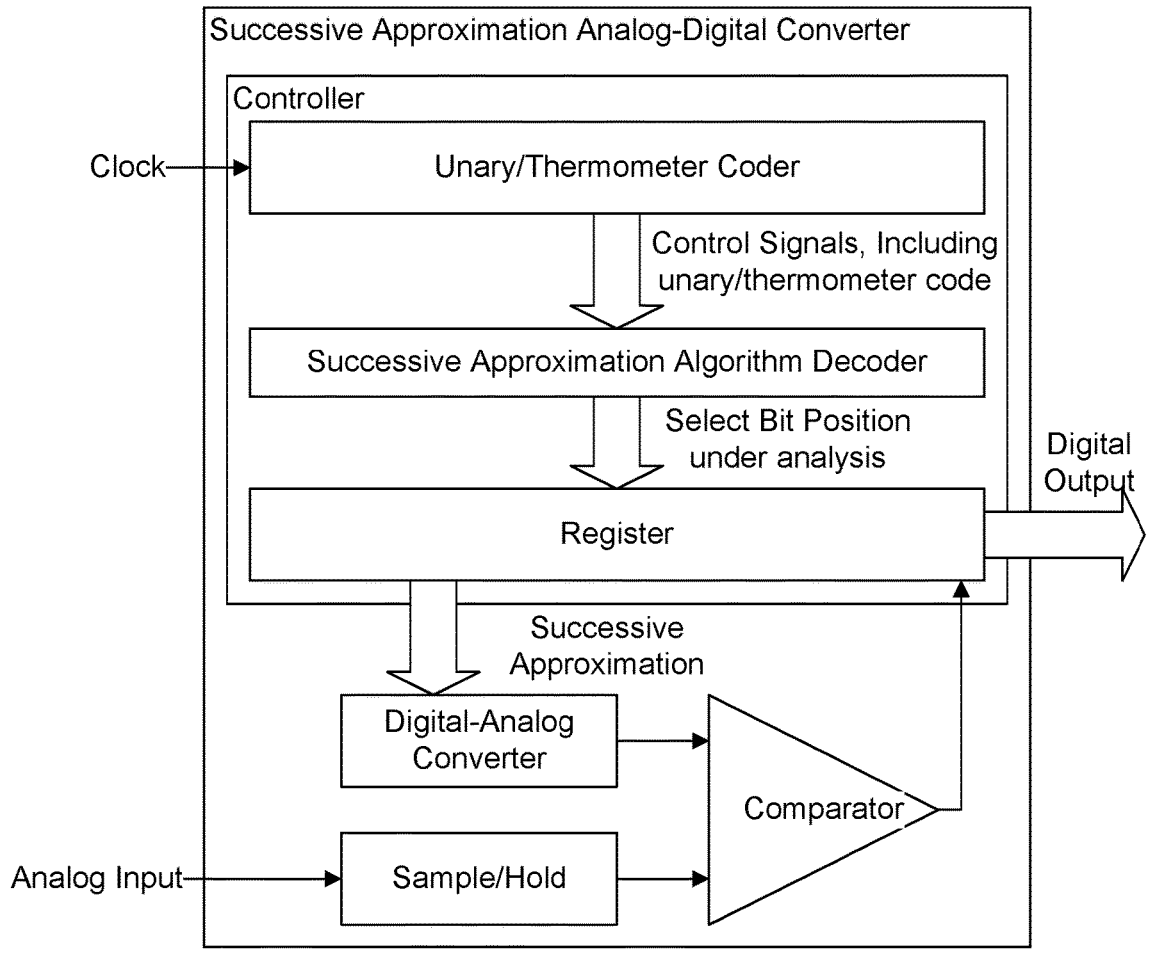
FIG. 1 shows an overview of a SAR ADC with a controller that includes a unary/thermometer coder in accordance with this invention.
FIG. 2 illustrates a unary/thermometer coding of (binary) numbers.

FIG. 1 shows an overview of a Successive Approximation Type of Analog-Digital converter. The first step of the Successive Approximation algorithm is for the Sample/Hold circuit to generate a Sampled input. The Register initialized the Digital-Analog-Converter at its initial center Successive Approximation value (MSB set; all other bits clear). The Comparator compares the signals from Digital-Analog-Converter (DAC) and Sample/Hold. The Comparison result is fed to the Register, which uses it to adjust the Successive Approximation value towards the Sampled Input by setting or clearing the MSB, based on whether the sampled input is greater than or less than the signal from the DAC, respectively. These steps are then repeated for the next less significant bit until the Comparator has executed N comparisons for an N-bit conversion. Afterwards the Digital Output is made available and the algorithm restarts. This highly repeatable algorithm is controlled from a Successive Approximation Algorithm Decoder, the output of which is a combinational function of the unary/thermometer signal received from the unary/thermometer coder.

FIG. 2 shows a table explaining a unary/thermometer coding of binary numbers, which may be one example of the output, provided by the coder inside the Controller from FIG. 1. As used herein, the terms zero and one, or 0 and 1, indicate the pair of values that a binary signal may have; as is well known in the art, the actual voltages assigned to each value is arbitrary, provided that the two voltages are distinguishable, and that the logic devices perform appropriately with these voltages. In logic terms, zero and one may correspond to "false" and "true" respectively.

FIGS. 3a-e show coder outputs after various numbers of clock edges. It is apparent that the output signal is a unary/thermometer-type code of which the number of ones increases.

FIG. 4 shows a stage-1 electronic circuit SL1 according to the invention. The circuit comprises a first NAND gate, having two inputs C1, E1 and an output P, a second NAND gate, having two inputs P, Q0 and an output QN1, an inverter having an input QN1 and an output Q1, a set-reset (SR) latch comprising mutually coupled third and fourth NAND gates, the latch having a set input, a reset input R1, a positive state output Q0 and a negative state output QN0. The clock C1, enable E1, and reset R1 inputs are made available as input connections.

The pulse-like output P of the first NAND gate serves as a clocking signal that is enabled when signal E1 is one, and is coupled to a first input of the second NAND gate and to the set input of the SR latch. A positive state output Q0 of the SR latch is coupled to the second input of the second NAND gate. A negative state output QN1 of the second NAND gate is coupled to the input of the inverter and the output of the inverter is made available as positive state output Q1 connection.

The outputs Q1, Q0 form a two-bit unary/thermometer code, with Q1 as the most significant bit (MSB), and Q0 as the least significant bit (LSB). The Q0 and Q1 outputs are reset to zero when R1 and E1 are set to zero. The circuit is enabled when R1 and E1 are set to one.

Before E1 is set to one, the output P of the first NAND gate will be held at one, which will have no effect on the second NAND gate, because Q0 has been reset to zero, and it will have no effect on the SR latch because only a zero input will change the state of the latch after it has been reset. After E1 is set to one, the output P will be the inverse of the clock signal C1. Preferably, E1 is set to one when the clock input C1 is at zero, to hold P at one until the next transition of the clock input C1.

When C1 goes to one, P will be set to zero, which will cause the SR latch to be set, changing Q0 to one. P being at zero will also force the second NAND gate to remain set to one, keeping Q1 set to zero.

When C1 next goes to zero, P will be set to one, which will force the second NAND gate to go to zero, changing Q1 to one. The transition of P to one will have no effect on the SR latch, keeping Q0 set to one. Thus, the two-bit output for the above sequence will be: 00, 01, 11.

It is significant to note that the output Q0 of the SR latch is used to hold the state of the LSB, as well as to control the enabling of the second NAND gate to set the output Q1 on the next transition of the clock signal C1 from one to zero.

As an option, in order to enable building a circuit that outputs a running one, or a running zero, the output P of the first NAND gate may be made available as an output connection. As a further option, in order to be able to output a negative unary/thermometer, the output QN1 of the second NAND gate and a negative state output QN0 of the latch may be made available as output connections.

One of skill in the art will recognize that equivalent ("dual") circuit elements may be used in lieu of the devices illustrated. For example, At the lowest level, the cross-coupled NAND gates of the set-reset latch could be replaced by a pair of cross-coupled NOR gates (with appropriate polarity inversions to the set and reset inputs). In like manner, a NAND gate can be replaced by an OR gate with inverted inputs, and a NOR gate can be replaced by an AND gate with inverted inputs.

FIG. 5 shows a stage-2 assembly SL2 of two electronic circuits from FIG. 4, which are here referred to as SL1A and SL1B, and a NOR gate. The two inputs, clock C2 and enable E2, of the NOR gate are made available as input connections; and the output of the NOR gate, which serves as a second stage clocking signal that is enabled when E2 is zero, is coupled to the clock inputs C1 of both electronic circuits SL1A, SL1B. The positive state output of the first electronic circuit Q1B is coupled to the enable E1 and reset R1 inputs of the second electronic circuit SL1A and the negative state output QN1B of the first electronic circuit SL1B is coupled to the enable input E1 of the first electronic circuit SL1B.

It is significant to note that the stages SL1A and SL1B are selectively enabled, and that SL1A will not be enabled until after the MSB Q1B of SL1B is set to one; this signal Q1B also maintains SL1A in a reset state until Q1B is set to one. The inverse of this signal QN1B also removes the enable signal E1 from SL1B, such that it retains its current state. That is, SL1A is not enabled until it is needed to change state, and SL1B is disabled after it reaches its maximum state, thereby minimizing transient power consumption. Also note that the input clock signal C2 is only coupled to one logic gate, which minimizes the loading (fanout) on the clock signal.

The outputs Q1A, Q0A, Q1B, Q0B of the two electronic circuits SL1A, SL1B are made available as positive state output connections, creating a four-bit unary/thermometer coding, with Q1A as the MSB, and Q0B as the LSB. The reset input R1 of the second electronic circuit SL1B is made available as a reset input connection R2, which will reset all the positive Q outputs to zero when it is zero. When enabled, this stage-2 assembly will produce the following sequence of outputs: 0000, 0001, 0011, 0111, 1111.

Optionally, in an embodiment, the pulse outputs P of the respective circuits SL1A, SL1B may be made available as output connections PA, PB, for creating a running one, or running zero circuit, and the outputs QN1A, QN0A, QN1B, QN0B of the electronic circuits SL1A, SL1B may be made available as negative state output connections, in order to provide an inverse unary/thermometer output.

FIG. 6 shows a stage-3 assembly of two assemblies from FIG. 5, forming a third-stage of the unary/thermometer coder. This third level assembly SL3 comprises two second level assemblies SL2A, SL2B as described above with reference to FIG. 5, and a NAND gate, wherein the clock C3 and enable E3 inputs of the NAND gate are made available as input connections; and the output of the NAND gate form a third-stage clocking signal and is coupled to the inputs C2 of both electronic circuits SL2A, SL2B.

The positive state output Q1AB of the first second level assembly SL2B is coupled to the reset input R2 of the second second level assembly SL2A and to the enable input E2 of the first second level assembly SL2B. A negative state output of the first electronic circuit QN1AB is coupled to the enable input E2 of the second second level assembly SL2A.

As in the second stage of FIG. 5, it is significant to note that the stages SL2A and SL2B are selectively enabled, and that SL2A will not be enabled until after the MSB Q1AB of SL2B is set to one (QN1AB set to zero). Also note that after Q1AB is set to one, SL2B is not enabled, and will retain its current state. That is, SL2A is not enabled until it is needed to change state, and SL2B is not enabled once it reaches its maximum state (Q1AB and Q0AB set to one), thereby minimizing transient power consumption. Also as in FIG. 5, the clock signal C3 is only coupled to one logic gate, thereby minimizing its loading (fanout).

The outputs Q1AA, Q0AA, Q1BA, Q0BA, Q1AB, Q0AB, Q1BB, Q0BB of the two second level assemblies SL2A, SL2B are made available as positive output connections, and form an 8-bit unary/thermometer coding, with Q1AA as the MSB, and Q0BB as the LSB.

For ease of illustration, the optional P signals from the second level assemblies are not shown. However, if a moving one output is required, the outputs PA and PB of the respective circuits SL2A, SL2B may be made available as output connections. The outputs QN0AA, QN1AA, QN0BA, QN1BA, QN0AB, QN1AB, QN0BB, QN1BB of the electronic circuits SL2A, SL2B may be made available as negative state output connections for creating an inverse unary/thermometer signal.

The output of this 8-bit unary/thermometer coder can be used by a Successive Approximation Algorithm Decoder to control the other parts of the analog-to-digital converter, as indicated in FIG. 1, with C3, E3, and R3 serving as the clock, enable, and reset inputs. In this embodiment, the coder is reset to zero when E3 and R3 are zero, and enabled when E3 and R3 are at one. When enabled, each transition of the clock signal C3 (both rising and falling) will cause a subsequent Q output to be set to one. The output can serve, for example, to indicate which bits of the Successive Approximation Algorithm Decoder have been processed.

It is significant to note that at stage-1, a NAND gate was used to provide the clocking signal, at stage-2, a NOR gate was used, and at stage-3, a NAND gate was used. This alternating NAND-NOR arrangement will be repeated with each additional stage. That is, for example, a four stage coder (16-bits) would use a NOR gate, a five stage coder (32-bits) would use a NAND gate, etc.

One of skill in the art will recognize that when a number of n cascaded stages are insufficient, but n+1 stages are more than required, an intermediate implementation can be made using only enough SLs as needed, with suitably staging. That is, if a 12-bit unary/thermometer coder is required, it could be formed using one SL3 (8-bits) and one SL2 (4-bits).

The above given examples are exemplary only and serve in no way to limit the scope of protection as defined in the following claims.

In the following claims, the logic terms of NOT, AND, NAND, OR, and NOR (capitalized) are to be interpreted in their standard form. NOT(zero) is one; NOT(one) is zero. AND is one only when all of its arguments are one. NAND is zero only when all of its arguments are one. OR is one when any of its arguments are one. NOR is zero when any of its arguments are one.

In interpreting these claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) any of the disclosed devices or portions thereof may be combined together or separated into further portions unless specifically stated otherwise;

e) the term "plurality of" an element includes two or more of the claimed element, and does not imply any particular range of number of elements; that is, a plurality of elements can be as few as two elements, and can include an immeasurable number of elements.

I claim:

1. A unary/thermometer coder circuit comprising:
a first stage circuit comprising:
a first logic circuit that receives a first clock input and a first enable input and provides a first clocking signal;
a set-reset latch that receives the first clocking signal as a set input, and a first reset input as a reset input and provides a first output; and
a second logic circuit that receives the first clocking signal and the first output to provide a second output;
wherein:
the first output and the second output form a two-bit unary/thermometer code based on the first clock input.

2. The circuit of claim 1, wherein:
the first clocking signal is equivalent to NOT(the first clock input AND the first enable input);
the second output is equivalent to the first clocking signal AND the first output.

3. The circuit of claim 1, wherein the first logic circuit is a combinatorial, non-sequential, logic circuit.

4. The circuit of claim 1, wherein the cross-coupled logic gates comprise cross-coupled NAND gates.

5. The circuit of claim 1, wherein the cross-coupled logic gates comprise cross-coupled NOR gates.

6. The circuit of claim 1, comprising:
a second stage circuit comprising:
a third logic circuit that receives a second clock input and a second enable input and provides a second clocking signal;
a first instantiation of the first stage circuit that provides the first and second outputs; and
a second instantiation of the first stage circuit that provides a third output and a fourth output;
wherein:
the second clocking signal is coupled to the first clock input of the first and second instantiations of the first stage circuits;
NOT(the second output) is coupled to the first enable input of the first instantiation of the first stage circuit;
a second reset input is coupled to the first reset input of the first instantiation of the first stage circuit;
the second output signal is coupled to the first enable input and the first reset input of the second instantiation of the first stage circuit; and
the first, second, third, and fourth outputs form a four-bit unary/thermometer code based on the second clock input.

7. The circuit of claim 6, wherein the third logic circuit is equivalent to NOT(the second clock input OR the second enable input).

8. The circuit of claim 6, comprising
a third stage circuit comprising:
a fourth logic circuit that receives a third clock input and a third enable input and provides a third clocking signal;
a first instantiation of the second stage circuit that provides the first, second, third, and fourth outputs; and
a second instantiation of the second stage circuit that provides a fifth, sixth, seventh and eighth outputs;
wherein:
the third clocking signal is coupled to the second clock input of the first and second instantiations of the second stage circuit;
the fourth output signal is coupled to the second enable input of the first instantiation of the second stage circuit and to the second reset input of the second instantiation of the second stage circuit;
NOT(the fourth output) is coupled to the second enable input of the second instantiation of the second stage circuit;
a third reset input is coupled to the second reset input of the first instantiation of the second stage circuit; and
the first, second, third, fourth, fifth, sixth, seventh and eighth outputs form an eight-bit unary/thermometer code based on the third clock input.

9. The circuit of claim 8, wherein the fourth logic circuit is equivalent to NOT(the third clock input AND the third enable input).

10. The circuit of claim 8, wherein the first, second, and third stage circuits are also configured to produce a 'walking one' or 'walking zero' output sequence.

11. An analog to digital converter comprising:
a controller circuit that includes a unary/thermometer coder that provides a unary/thermometer coded output based on a clock input;
a successive approximation algorithm decoder circuit that selects the bit position under analysis based on the unary/thermometer coded output;
a register circuit that provides a digital output which is a successive approximation of a sampled analog signal;
a digital-to-analog converter circuit that converts the digital output to an analog reference value;
a sample/hold circuit that receives an analog input signal and provides a sampled analog signal;
a comparator that compares the analog reference value and the sampled analog signal to provide a binary comparison result;
wherein the register circuit uses the binary comparison result to provide a next successive approximation of the digital output;
wherein the unary/thermometer coder includes a plurality of stages, wherein each stage includes one or more first stage circuits comprising:
a first logic circuit that receives a clock input and an enable input and provides a clocking signal;
a set-reset latch that receives the clocking signal as a set input, and a reset input as a reset input and provides a first output; and
a second logic circuit that receives the clocking signal and the first output to provide a second output; and
wherein the first output and the second output form a two-bit unary/thermometer code based on the clock input.

12. The converter of claim 11, wherein the unary/thermometer coder includes two pairs of second stage circuits, wherein each second stage circuit comprises two first stage circuits, and the unary/thermometer coded output corresponds to an 8-bit unary/thermometer coded output.

* * * * *